United States Patent
Hikmet et al.

(10) Patent No.: US 11,326,746 B2
(45) Date of Patent: May 10, 2022

(54) LIGHTING DEVICE WITH LIGHT-EMITTING FILAMENTS

(71) Applicant: SIGNIFY HOLDING B.V., Eindhoven (NL)

(72) Inventors: Rifat Ata Mustafa Hikmet, Eindhoven (NL); Ties Van Bommel, Horst (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 17/299,099

(22) PCT Filed: Dec. 5, 2019

(86) PCT No.: PCT/EP2019/083858
§ 371 (c)(1),
(2) Date: Jun. 2, 2021

(87) PCT Pub. No.: WO2020/120286
PCT Pub. Date: Jun. 18, 2020

(65) Prior Publication Data
US 2022/0057052 A1 Feb. 24, 2022

(30) Foreign Application Priority Data
Dec. 13, 2018 (EP) ..................... 18212418

(51) Int. Cl.
*F21K 9/61* (2016.01)
*F21K 9/66* (2016.01)
(Continued)

(52) U.S. Cl.
CPC ............ *F21K 9/61* (2016.08); *F21K 9/66* (2016.08); *F21S 8/04* (2013.01); *F21V 7/005* (2013.01);
(Continued)

(58) Field of Classification Search
CPC ...... F21K 9/61; F21K 9/66; F21S 8/04; F21V 7/005; F21Y 2103/10
See application file for complete search history.

(56) References Cited

U.S. PATENT DOCUMENTS

2014/0103373 A1 4/2014 Li et al.
2014/0268779 A1* 9/2014 Sorensen ............ F21K 9/232
362/249.06
(Continued)

FOREIGN PATENT DOCUMENTS

CN 203810164 U 9/2014
CN 207424459 U 5/2018
(Continued)

*Primary Examiner* — Evan P Dzierzynski
(74) *Attorney, Agent, or Firm* — Daniel J. Piotrowski

(57) ABSTRACT

A lighting device (5) is disclosed. The lighting device (5) comprises a plurality of light-emitting filaments (10), wherein each of the light-emitting filaments (10) comprises a plurality of solid-state light sources mounted on a carrier along a longitudinal axis of the light-emitting filament (10). The light-emitting filaments (10) are arranged in a planar configuration, and the lighting device (5) has a main direction of illumination (I) perpendicularly away from a plane (P) defined by the planar configuration. The longitudinal axes (L1, L2) of at least two light-emitting filaments (10) are non-parallel to each other. A luminaire comprising the lighting device is also disclosed. The lighting device (5) can be produced in a cost-efficient manner.

12 Claims, 5 Drawing Sheets

(51) Int. Cl.
  *F21S 8/04* (2006.01)
  *F21V 7/00* (2006.01)
  *F21Y 103/10* (2016.01)
  *F21Y 115/10* (2016.01)

(52) U.S. Cl.
  CPC ....... *F21Y 2103/10* (2016.08); *F21Y 2115/10* (2016.08)

(56) References Cited

U.S. PATENT DOCUMENTS

2014/0355292 A1* 12/2014 Krause .................. G02B 6/001
                                                        362/555
2017/0012177 A1*  1/2017 Trottier .................... F21K 9/00
2018/0031185 A1   2/2018 Pettmann
2019/0139943 A1*  5/2019 Tiwari ................ H01L 25/0753

FOREIGN PATENT DOCUMENTS

| EP | 2636942 A1 | 9/2013 |
| EP | 2827046 A1 | 1/2015 |
| WO | 2015103813 A1 | 7/2015 |
| WO | 2016011609 A1 | 1/2016 |

* cited by examiner

LIGHTING DEVICE WITH LIGHT-EMITTING FILAMENTS

CROSS-REFERENCE TO PRIOR APPLICATIONS

This application is the U.S. National Phase application under 35 U.S.C. § 371 of International Application No. PCT/EP2019/083858, filed on Dec. 5, 2019, which claims the benefit of European Patent Application No. 18212418.0, filed on Dec. 13, 2018. These applications are hereby incorporated by reference herein.

FIELD OF THE INVENTION

The present invention relates to a lighting device with light-emitting filaments and to a luminaire comprising such a lighting device.

BACKGROUND OF THE INVENTION

A common type of lighting devices has light-emitting diodes (LEDs) arranged in a plane and emit light in a main direction of illumination that is perpendicular to the plane. Many LED spots and LED downlights belong to this category of lighting devices. While existing lighting devices of this type are suitable for their intended use, there is a perceived need for further technical development, for example, with regards to reducing production costs.

In EP 2636942 A light bulb shaped lamp is disclosed, including: a hollow globe; an LED module including a base platform and an LED chip mounted on the base platform, the LED module being provided in the globe; a lead wire for supplying power to the LED module; and a stem extending toward the interior of the globe, in which the base platform is directly fixed to the stem.

SUMMARY OF THE INVENTION

According to a first aspect of the present invention, there is presented a lighting device comprising a plurality of light-emitting filaments, wherein each of the light-emitting filaments comprises: an elongated carrier defining a longitudinal axis of the light-emitting filament; a plurality of solid-state light sources mounted on the carrier along the longitudinal axis, wherein each solid-state light source is configured to emit light from a light-emitting surface; and an encapsulant comprising a luminescent material, wherein the encapsulant at least partially encloses the light-emitting surfaces of the solid-state light sources and is configured to at least partly convert light emitted by the solid-state light sources to wavelength-converted light, wherein the light-emitting filaments are arranged in a planar configuration, wherein the lighting device has a main direction of illumination perpendicularly away from a plane defined by the planar configuration, and wherein the longitudinal axes of at least two light-emitting filaments are non-parallel to each other.

According to a second aspect of the present invention, there is presented a luminaire comprising: at least one lighting device according to the first aspect of the present invention; an electrical connection electrically connected to the at least one lighting device and configured to supply power to the at least one lighting device; and an exit window arranged to release light emitted by the at least one lighting device to the surroundings of the luminaire.

By the light-emitting filaments being arranged in a "planar configuration" is meant that each light-emitting filament is arranged in a plane and that these planes substantially coincide. In practice, the planes may of course not exactly coincide, for example due to manufacturing and assembly tolerances.

Filaments based on solid-state lighting technology have traditionally been used in LED light bulbs designed to resemble traditional incandescent light bulbs. The present invention is based on the realization that such filaments can be used in lighting devices in which the light source(s) should have a planar configuration, such as some common types of spots and downlights. The present invention allows for cost-effective production of such lighting devices. Moreover, the present invention allows for easy production of lighting devices that emit light having a homogenous distribution.

The elongated carrier may be transparent. Thereby, the light-emitting filaments may be configured to emit light substantially omni-directionally about the longitudinal axis of the light-emitting filament.

The plurality of light-emitting filaments may be symmetrically arranged around an optical axis of the lighting device, the optical axis being perpendicular to the plane defined by the planar configuration. Arranging the light-emitting filaments in this manner may help to further increase the homogeneity of the light emitted by the lighting device.

The plurality of light-emitting filaments may comprise at least three light-emitting filaments, the longitudinal axes of which are radially arranged with respect to the optical axis. Arranging the light-emitting filaments in this manner may help to further increase the homogeneity of the light emitted by the lighting device. The number of light-emitting filaments arranged in this manner may for example be three, four, five, six, seven, eight, nine or greater than nine. Using a relatively large number of light-emitting filaments may help to further increase the homogeneity of the light emitted by the lighting device. The longitudinal axes of the at least three light-emitting filaments may be arranged at equal angles from each other, or at substantially equal angles, the angles being in the plane defined by the planar configuration. Differently stated, the at least three light-emitting filaments may be arranged such that the angles between the longitudinal axes of all neighboring light-emitting filaments are equal, or substantially equal.

The plurality of light-emitting filaments may comprise at least three light-emitting filaments, the longitudinal axes of which are perpendicularly arranged with respect to radial directions to the optical axis. Arranging the light-emitting filaments in this way may result in the light emitted by the lighting device being particularly homogenous. The number of light-emitting filaments arranged in this manner may for example be three, four, five, six, seven eight, nine or greater than nine. Using a relatively large number of light-emitting filaments may help to further increase the homogeneity of the light emitted by the lighting device.

It is noted that the lighting device does not have to be provided with a collimator. However, in some applications, it is desirable that the lighting device emit collimated light. In such case, the lighting device may further comprise a collimator configured to collimate light emitted by the plurality of light-emitting filaments in a direction parallel to the plane defined by the planar configuration. The collimator may for example be a Total Internal Reflection (TIR) collimator or a reflector configured to collimate light.

The collimator may be configured to individually collimate light emitted by each light-emitting filament. For example, the collimator may comprise a plurality of sub-collimators, each sub-collimator being configured to collimate light emitted by one of the light-emitting filaments. The sub-collimators may for example be TIR collimators and/or reflectors configured to collimate light. Each sub-collimator may be configured to collimate light emitted by the corresponding light-emitting filament in a direction perpendicular to its longitudinal axis and in a direction parallel to the plane defined by the planar configuration.

It may be noted that providing the lighting device with a collimator and a transparent carrier may result in a particularly large fraction of the light leaving the lighting device being well collimated.

The light-emitting filaments may be arranged to form at least one of a polygon shape and a star shape.

The collimator may have a surface facing the main direction of illumination, and each sub-collimator may be formed by a recess in said surface. Each recess may for example have a parabolic shape. Each recess may at least partly receive one of the light-emitting filaments or completely receive one of the light-emitting filaments. Differently stated, each light-emitting filament may be at least partly arranged in one of the recesses or completely arranged in one of the recesses. Each light-emitting filament may be arranged at a distance from an inner surface of the corresponding recess. Each light-emitting filament may for example be arranged at a focal point of the corresponding recess/sub-collimator.

The lighting device may further comprise a controller configured to control the light emitted by the light-emitting filaments. The controller may for example be configured to control each light-emitting filament individually. Alternatively, or additionally, to the controller may be configured to individually control groups of several light-emitting filaments. For example, the lighting device may comprise a first group of at least two light-emitting filaments, the first group having a first orientation in the plane defined by the planar configuration, and a second group of at least two light-emitting filaments, the second group having a second orientation in the plane of the planar configuration. The first orientation may be different from the second orientation, and the controller may be configured to individually control the first and second groups of light-emitting filaments. It is noted that different light-emitting filaments belonging to the same group may have different orientations in the plane defined by the planar configuration.

It is noted that the invention relates to all possible combinations of features recited in the claims.

BRIEF DESCRIPTION OF THE DRAWINGS

This and other aspects of the present invention will now be described in more detail, with reference to the appended drawings showing examples of embodiments of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
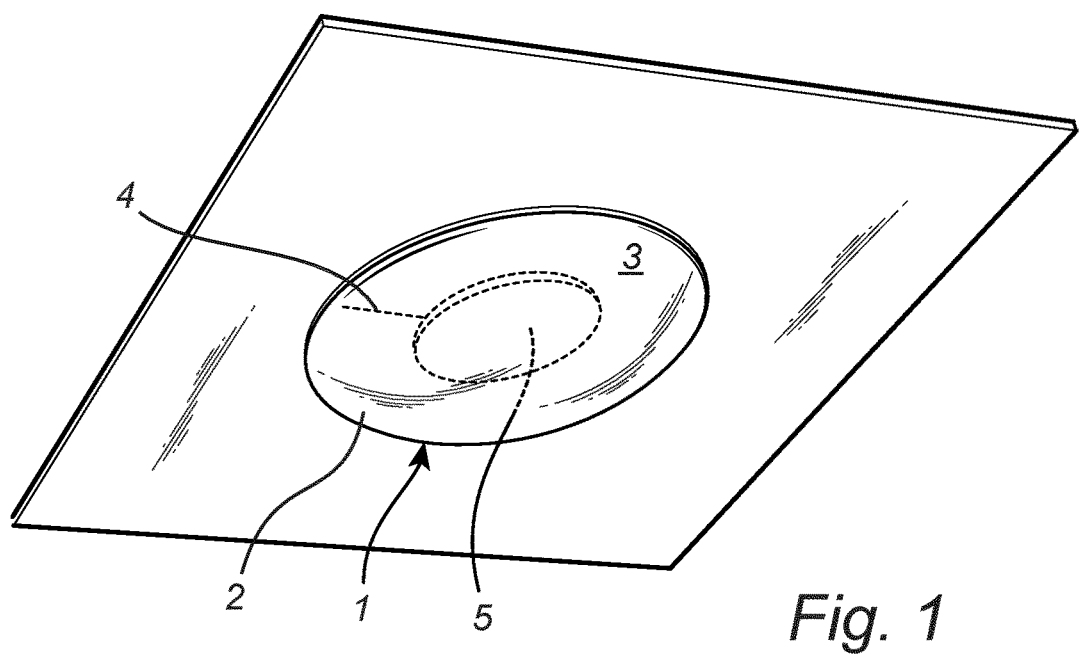
FIG. 1 shows a schematic perspective view of a luminaire according to an embodiment of the present invention.

FIG. 1 shows a luminaire 1 mounted to a ceiling for illuminating a room. The luminaire 1 illustrated in FIG. 1 may be referred to as a downlight lamp. The luminaire 1 here comprises a cover 2, an exit window 3, an electrical connection 4 and a lighting device 5. The exit window 3 is arranged so that light emitted by the lighting device 5 is released to the room. In this case, the exit window 3 is integrated with the cover 2. More specifically, the exit window 3 is formed by a transparent portion of the cover 2. The electrical connection 4 is here electrically connected to supply the lighting device 5 with power from the mains.

Figure 2:
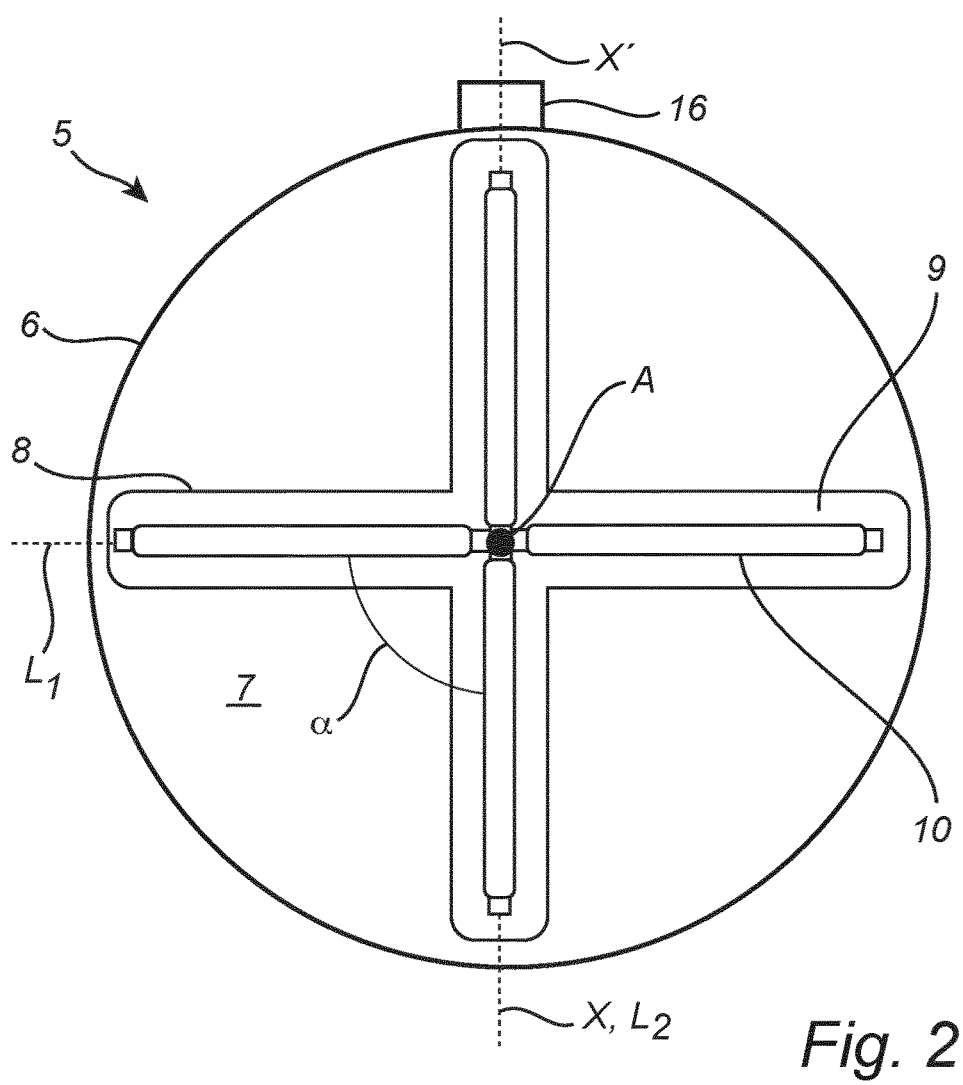
FIG. 2 shows a schematic top plan view of the lighting device included in the luminaire shown in FIG. 1.
Figure 3:
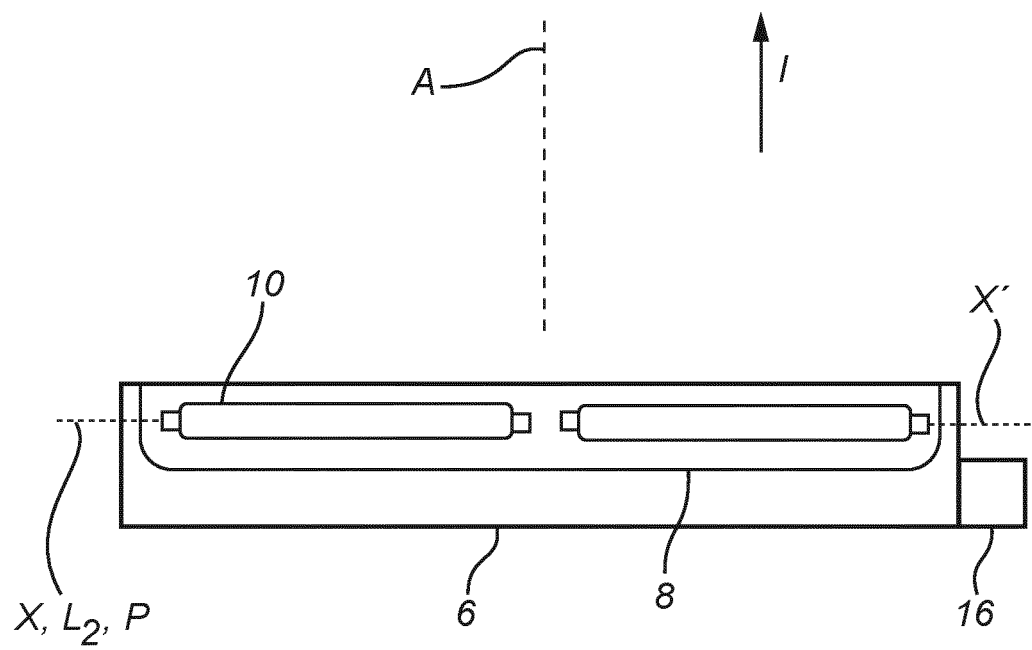
FIG. 3 shows a schematic cross-sectional view along the line X-X' in FIG. 2.

With reference to FIGS. 2 and 3, the lighting device 5 will now be described in more detail. The lighting device 5 has an optical axis A (which points out of the paper in FIG. 2). The main direction of illumination I of the lighting device 5 is here parallel to the optical axis A. Further, the lighting device 5 comprises in this case a collimator 6. The collimator 6 here has a flat and circular shape. The collimator 6 does not have to be circular in a different example, but may for example have a polygonal shape, such as a square shape or some other rectangular shape. The collimator 6 may for example be made of a plastic material. The collimator 6 has a surface 7 facing the main direction of illumination I. The surface 7 is in this case flat and circular. Further, the surface 7 is in this case perpendicular to the optical axis A.

The collimator 6 here comprises four sub-collimators 8. The number of sub-collimators may of course be greater or smaller than four in a different example. The sub-collimators 8 are here reflectors. It is, however, possible to use other types of collimators, such as total internal reflectors. Each sub-collimator 8 is formed by a recess in the surface 7. The inner surfaces 9 of the recesses 8 are configured to reflect light. For example, the recesses may be provided with a reflective coating forming the inner surfaces 9. Each sub-collimator 8 here has a straight, elongated shape. The sub-collimators 8 are in this case arranged radially with respect to the optical axis A. That is to say, the longitudinal axis of each sub-collimator 8 is arranged along a radial direction with respect to the optical axis A. Further, the sub-collimators 8 are in this case arranged symmetrically around the optical axis A. Specifically, there is in this case an angle of approximately 90 degrees between the longitudinal axes of each two neighboring sub-collimators 8. Further, each sub-collimator 8 is in this case integrated with the other sub-collimators 8 at one of its two longitudinal ends.

As is best seen in FIG. 2, the sub-collimators 8 together form a cross-like shape centered on the optical axis A.

The lighting device 5 further comprises four light-emitting filaments 10, henceforth referred to as the "filaments" for brevity. The number of filaments 10 may be greater or lower than four in a different example. Each sub-collimator 8 is arranged to collimate light from one of the filaments 10. Thus, the collimator 6 is here configured to individually collimate light emitted by the filaments 10. One filament 10 is arranged in each recess/sub-collimator 8. Specifically, each filament 10 is here arranged at a distance from the inner surface 9 of the recess receiving the filament 10, so as to be located at a focal point of the recess. The distance may for example be at least 2 mm, alternatively at least 4 mm or at least 5 mm, such as 7 mm or 10 mm. Each filament 10 is here elongated and straight. Further, each filament 10 is arranged so that its longitudinal axis is substantially parallel with the longitudinal extension of the recess 8 in which it is arranged. Still further, the filaments 10 are arranged in a planar configuration defining a plane P. That is to say, all of the filaments 10 lie substantially in the plane P. In this case, the plane P, in which the filaments 10 lie, is substantially parallel with the surface 7 of the collimator 6. As is best seen in FIG. 3, the main direction of illumination I and the optical axis A are here perpendicular to the plane P. In FIG. 2, the plane P is parallel to the plane of the paper.

The four filaments 10 are in this case arranged symmetrically around the optical axis A. Specifically, the longitudinal axes of the filaments 10 are radially arranged with respect to the optical axis A. Stated differently, the longitudinal axes here point radially away from the optical axis A. There is in this case an angle α of approximately 90 degrees between each neighboring pair of filaments 10. Hence, the filaments 10 together form a cross-like shape centered on the optical axis A. Further, it is noted that the longitudinal axis of each of the filaments 10 is here non-parallel with the longitudinal axis of two other filaments 10. For example, the longitudinal axes denoted by $L_1$ and $L_2$ in FIG. 2 are perpendicular to each other.

All of the filaments 10 are in this case of the same, conventional type known in the art. The filament 10 with the longitudinal axis denoted by $L_1$ in FIG. 2 will now be described in greater detail with reference to FIG. 4.

Figure 4:
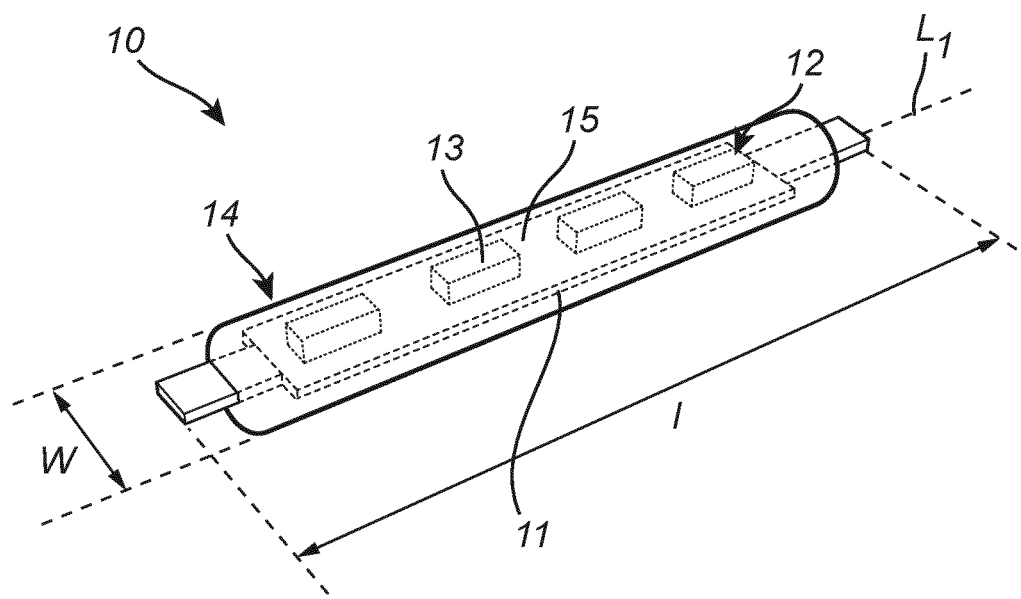
FIG. 4 shows a schematic perspective view of a light-emitting filament included in the lighting device shown in FIGS. 1 to 3.

The filament 10 shown in FIG. 4 has a length l and a width w. Both the length l and the width w are here measured in the plane P. The length l may for example be in the range from 1 cm to 20 cm, alternatively in the range from 2 cm to 12 cm or from 3 cm to 10 cm. The width w may for example be in the range from 0.5 mm to 10 mm, alternatively in the range from 0.8 mm to 8 mm or from 1 to 5 mm. The ratio l/w may for example be at least 5, alternatively at least 8 or at least 10.

Further, the filament 10 comprises a transparent carrier 11. Some examples of materials that the carrier 11 can be made of are glass, sapphire and quartz. The carrier 11 is here planar and elongated. The longitudinal axis of the carrier 10 is denoted by $L_1$ in FIG. 4. The longitudinal axis $L_1$ of the carrier 11 defines the longitudinal axis of the filament 10. The carrier 11 comprises electrical circuitry (not shown), such as electrically conductive tracks printed on the carrier 11.

Several solid-state light sources 12, henceforth referred to as the "light sources" for brevity, are mounted on the carrier 11. The light sources 12 are in this case mounted so as to form an array, here a linear array. The light sources 12 are in this case electrically connected to the electrical circuitry of the carrier 11. Each of the light sources 12 is configured to emit light from a light-emitting surface 13. Four light sources 12 are shown in FIG. 4, although the number of light sources 12 may be greater or smaller than four in a different example. The number of light sources 12 may for example be at least five, alternatively at least eight, ten, fifteen or twenty. The light sources 12 are in this example light-emitting diodes (LEDs), so the filaments 10 may be referred to as LED filaments. The light-emitting diodes may for example be semiconductor LEDs, organic LEDs or polymer LEDs. All of the light sources 12 are typically configured to emit light of the same color, although in some applications different light sources 12 may be configured to emit light of different colors.

The filament 10 in FIG. 4 further comprises an encapsulant 14. The encapsulant 14 typically comprises a polymer, such as a silicone-type of material. The encapsulant 14 covers the light-emitting surfaces 13. In this case, the encapsulant 14 completely encloses the carrier 11. Thus, the encapsulant 14 is provided on the side of the carrier 11 where the light sources 12 are arranged as well as on the side of the carrier 11 where there are no light sources 12. It may be noted that, if the carrier 11 is not transparent, the encapsulant 14 is typically only provided on the side of the carrier 11 where the light sources 12 are arranged, although this may of course also be the case if the carrier 11 is transparent.

The encapsulant 14 comprises a luminescent material 15 which in this case is distributed throughout the encapsulant 14. The luminescent material 15 may for example be an inorganic phosphor, an organic phosphor, quantum dots and/or quantum rods. The luminescent material 15 is configured to at least partly convert light emitted by the light sources 12 to converted light. The converted light has a different wavelength than the light emitted by the light sources 12. In many applications, the converted light has a longer wavelength than the unconverted light. The unconverted light may for example be blue and/or violet, and the converted light may for example be green, yellow, orange and/or red.

The color of the light emitted by the light sources 12 and the type of luminescent material 15 depend on the application. For example, the luminescent material 15 may be a phosphor and the light sources 12 may emit blue light and/or UV light which "pumps" the phosphor. Light sources 12 that are configured to emit red light are also used in some applications. The light emitted by the filament 10 thus comprises a mix of light converted by the luminescent material 15 and non-converted light emitted by the light sources 12. The ratio between the converted light and the non-converted light depends on how much of the light emitted by the light sources 12 that is converted by the luminescent material 15. In some applications, the luminescent material 15 and the color of the light emitted by the light sources 12 are chosen such that the filaments 10 emit light that resembles the light emitted by an incandescent filament, i.e. yellow light. Alternatively, the filaments 10 may be configured to emit white light. The white light may be light which is within 15 SDCM from the black body locus. The color temperature of such white light may for example be in the range from 2000 K to 6000 K, alternatively in the range from 2300 K to 5000 K or in the range from 2500 K to 4000 K. The color rendering index CRI of such white light may for example be at least 70, alternatively at least 80 or at least 85, such as 90 or 92.

Now turning back to FIGS. 2 and 3, it is noted that the lighting device 5 further comprises a controller 16 electrically connected to the filaments 10. The controller 16 is in this case configured to control the filaments 10 independently from each other. The controller 16 may for example be configured to turn the filaments 10 on or off, to vary the intensity of the light emitted by the filaments 10, and/or to control the color of the light emitted by the filaments 10. By turning different filaments 10 on or off, the controller 16 may for example be used to shape the beam of light leaving the luminaire 1.

It is noted that the controller 16 is an optional feature which may or may not be included in other examples of the lighting device 5. Also, it is noted that the controller 16 may be configured to control the filaments 10 in some other manner than independently from each other. For example, the controller 16 may be configured to individually control a first group and a second group, the two filaments that are parallel with the axis $L_1$ in FIG. 2 forming the first group, and the filaments that are parallel with the axis $L_2$ in FIG. 2 forming the second group. Thus, the filaments of the first group are perpendicular to the filaments of the second group. Such a controller 16 may be used to obtain elongated light beams with different orientations.

During operation, the lighting device 5 receives in this case power from the mains via the electrical connection 4. The filaments 10 emit light which is collimated by the collimator 6. The light leaves the luminaire 1 through the exit window 3 and illuminates the surroundings of the luminaire 1. Each sub-collimator 8 is in this case arranged such that light leaving it is collimated to a high degree in a direction which is parallel to the plane P and perpendicular to the longitudinal axis of the corresponding filament 10, i.e. a direction which is parallel with the width of the corresponding filament 10. The light is also collimated in a direction parallel to the longitudinal axis of the corresponding filament 10, but only to a relatively small degree.

Figure 5:
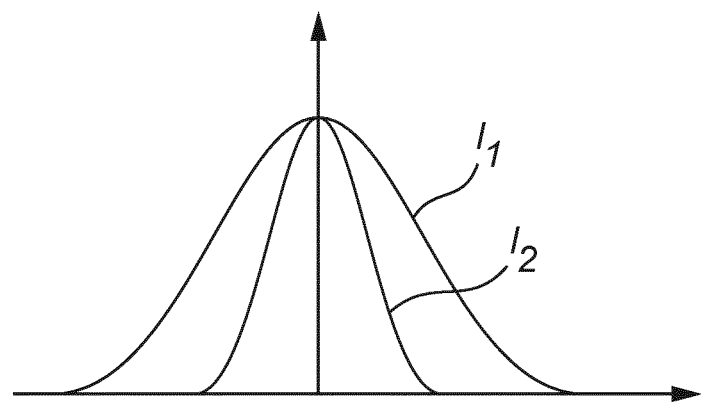
FIG. 5 is a schematic diagram with curves representing light intensity distributions.
Figure 6:
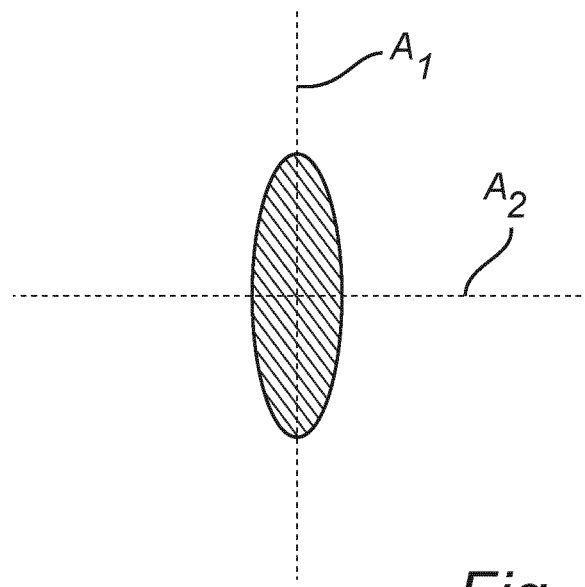
FIGS. 6 and 7 show schematic light patterns.
Figure 7:
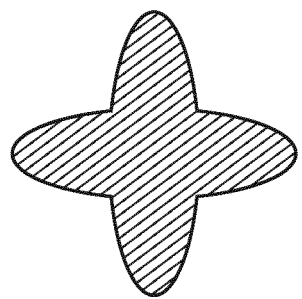

FIGS. 5, 6 and 7 schematically illustrate various aspects of the light leaving the lighting device 5 or the sub-collimators 8. Specifically, FIG. 5 shows the intensity distribution of the light leaving a single sub-collimator 8, the vertical axis representing intensity and the horizontal axis representing an angle. In the case of the curve denoted by $I_1$, the angle is between (i) the axis which is perpendicular to the plane P and located at the center of the filament 10 and (ii) the longitudinal axis of the filament 10. In the case of the curve denoted by $I_2$, the angle is between (i) the axis which is perpendicular to the plane P and located at the center of the filament 10 and (ii) an axis parallel to the width of the filament 10 and located at the center of the filament 10. It is clear from FIG. 5 that the curve $I_2$ represents a significantly higher level of collimation than the curve $I_1$.

FIG. 6 shows a projection of the light leaving one of the sub-collimators 8 on a plane which is parallel with the plane P, such as, in this case, the plane of a floor below the luminaire 1. The axes $A_1$ and $A_2$ are parallel with the longitudinal axis of the filament 10 and the width of the filament 10, respectively. Finally, FIG. 7 shows a projection of the light leaving the lighting device 5 on a plane which is parallel with the plane P, such as the plane of a floor below the luminaire 1.

Figure 8:
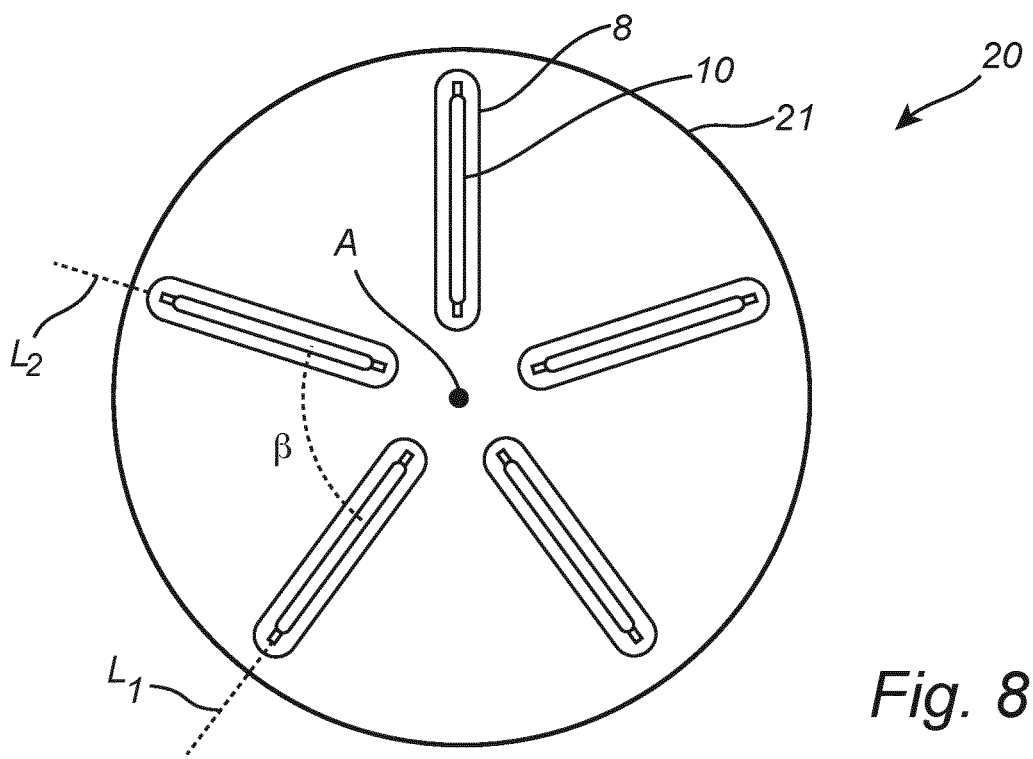
FIGS. 8 to 10 show schematic top plan views of lighting devices according to various embodiments of the present invention.
Figure 9:
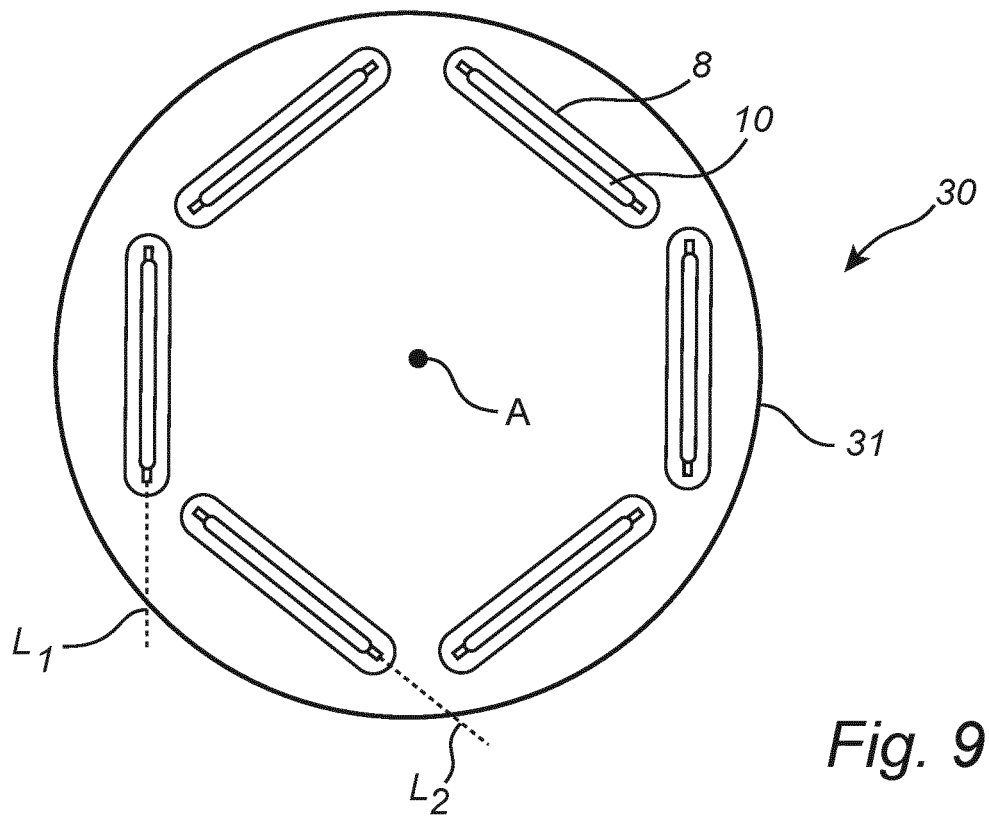
Figure 10:
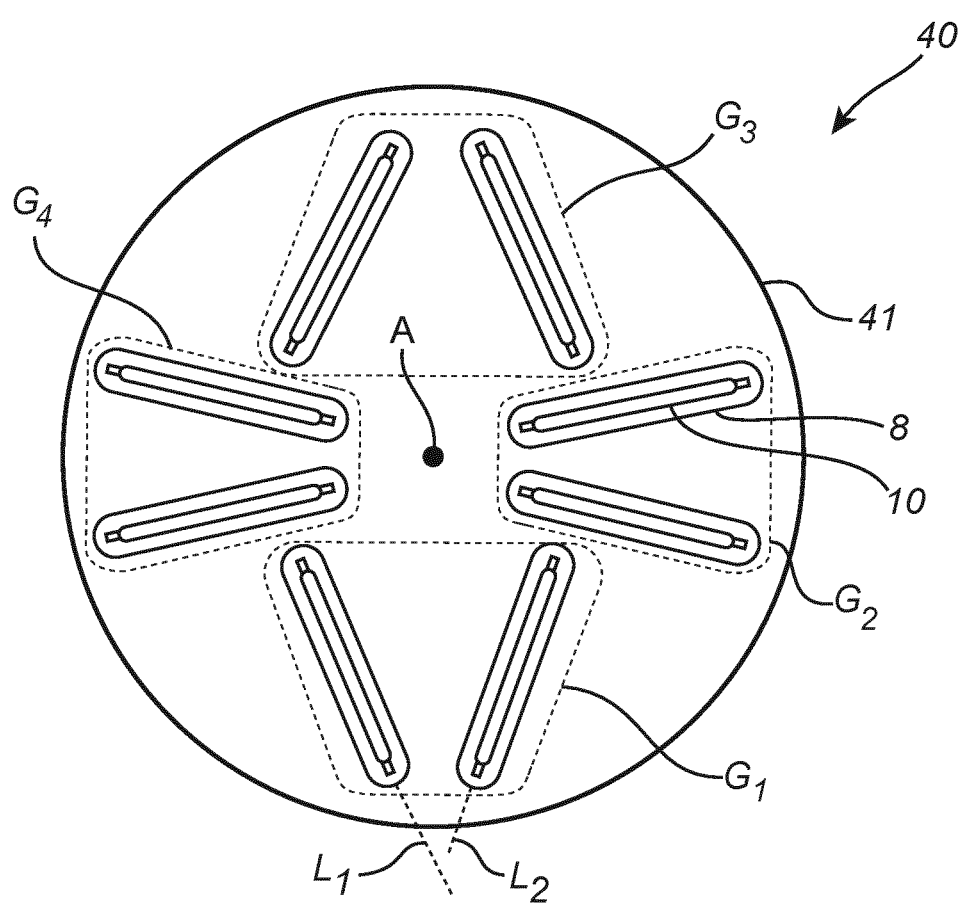

FIGS. 8 to 10 show lighting devices 20, 30, 40 that are similar to the lighting device 5 described above in connection with FIGS. 1 to 7, except in that the filaments 10 are arranged in other types of planar configurations. It is noted that some of these planar configurations may be combined. For example, the configuration shown in FIG. 8 may be combined with that shown in FIG. 9.

FIG. 8 shows a lighting device 20 with five filaments arranged so as to form a star shape. The star shape here has five "legs". In a different example, where the number of filaments 10 is different, the number of legs may of course also be different from five, either smaller or greater. In the plane defined by the planar configuration, there is an angle β between each the longitudinal axes of each neighboring pair of filaments 10. The longitudinal axes of two of the filaments 10 are denoted by $L_1$ and $L_2$ in FIG. 8. The angles β are in this case equal. Specifically, the angles β are 72 degrees. The sub-collimators 8 are in this case not integrated with each other at the optical axis A of the collimator 21. It should be noted, however, that a lighting device having the filaments arranged in a star shape may have the sub-collimators 8 integrated with each other at the optical axis A, similarly to the sub-collimators in FIGS. 2 and 3.

The lighting device 20 may be described as comprising five filaments 10 which are radially arranged with respect to the optical axis A at 0, 72, 144, 216 and 288 degrees about the optical axis A. Similarly, the lighting device 5 discussed above in connection with FIGS. 1 to 7 may be described as a lighting device comprising four filaments 10 which are radially arranged with respect to the optical axis A at 0, 90, 180 and 270 degrees with respect to the optical axis A. Further examples of lighting devices, which are similar to the lighting devices 5, 20 discussed above with respect to FIGS. 1 to 7 and which have filaments 10 that are radially arranged include: (i) a lighting device comprising two, four, six or eight filaments 10, wherein the filaments 10 are arranged at 0 and 90 degrees about the optical axis A; (ii) a lighting device comprising three, six, nine or twelve filaments 10, wherein the filaments 10 are arranged at 0, 120 and 240 degrees about the optical axis A; (iii) a lighting device comprising eight or twelve filaments 10, wherein the filaments 10 are arranged at 0, 90, 180 and 270 degrees about the optical axis A; (iv) a lighting device comprising ten or fifteen filaments 10, wherein the filaments 10 are arranged at 0, 72, 144, 216 and 288 degrees about the optical axis A; (v) a lighting device comprising six, twelve or eighteen filaments 10, wherein the filaments 10 are arranged at 0, 60, 120, 180, 240 and 300 degrees about the optical axis A; and (vi) a lighting device comprising seven, fourteen or twenty-one filaments 10, wherein the filaments 10 are arranged at 0, 51, 103, 154, 206, 259 and 309 degrees about the optical axis A.

FIG. 9 shows a lighting device 30 with six filaments arranged such that the longitudinal axis of each filament 10 is perpendicularly arranged with respect to a radial direction of the optical axis A of the lighting device 30. The longitudinal axes of two of the filaments 10 are denoted by $L_1$ and $L_2$ in FIG. 9. As is clear from FIG. 9, the longitudinal axes $L_1$ and $L_2$ are non-parallel. The filaments 10, and also the sub-collimators 8 of the collimator 31, are arranged so as to form a polygon shape. The polygon shape is here a hexagon shape. In a different example, where the number of filaments 10 is different, other polygon shapes are of course possible, such as pentagon shapes, heptagon shapes or octagon shapes.

FIG. 10 shows a lighting device 40 with the filaments 10, and the sub-collimators 8 of the collimator 41, arranged in groups. Specifically, there are in this case eight filaments 10 arranged in four groups of two filaments 10 each. The groups are denoted by $G_1$, $G_2$, $G_3$ and G4, respectively, in FIG. 10. Each group is oriented differently with respect to the optical axis A than the other groups. The longitudinal axes of two of the filaments 10 are denoted by $L_1$ and $L_2$, and it may be noted that these longitudinal axes $L_1$, $L_2$ are non-parallel. Further, it is noted that the lighting device 40 may be provided with a controller, such as the controller 16 in FIGS.

2 and 3. Such a controller may for example be configured to control the light emitted by the groups $G_1$, $G_2$, $G_3$, G4 of filaments 10 independently of each other.

The person skilled in the art realizes that the present invention by no means is limited to the preferred embodiments described above. On the contrary, many modifications and variations are possible within the scope of the appended claims. For example, lighting devices which do not include a collimator are conceivable.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A lighting device comprising a plurality of light-emitting filaments, wherein each of the light-emitting filaments comprises:
   an elongated carrier defining a longitudinal axis of the light-emitting filament;
   a plurality of solid-state light sources mounted on the carrier along the longitudinal axis, wherein each solid-state light source is configured to emit light from a light-emitting surface; and
   an encapsulant comprising a luminescent material, wherein the encapsulant at least partially encloses the light-emitting surfaces of the solid-state light sources and is configured to at least partly convert light emitted by the solid-state light sources to wavelength-converted light,
   wherein the light-emitting filaments are arranged in a planar configuration, wherein the lighting device has a main direction of illumination perpendicularly away from a plane defined by the planar configuration, and wherein the longitudinal axes of at least two light-emitting filaments are non-parallel to each other, and
   wherein said lighting device further comprising a collimator configured to collimate light emitted by the light-emitting filaments in a direction parallel to said plane, said collimator comprises a plurality of sub-collimators, each sub-collimator being configured to collimate light emitted by one of the light-emitting filaments, and wherein the collimator has a surface facing the main direction of illumination, and each sub-collimator is formed by a recess in said surface, and wherein each recess at least partly receives one of the light-emitting filaments.

2. The lighting device according to claim 1, wherein the light-emitting filaments are symmetrically arranged around an optical axis of the lighting device, the optical axis being perpendicular to said plane.

3. The lighting device according to claim 1, wherein the plurality of light-emitting filaments comprises at least three light-emitting filaments, the longitudinal axes of which are radially arranged with respect to the optical axis.

4. The lighting device according to claim 3, wherein the longitudinal axes of the at least three light-emitting filaments are arranged at equal angles from each other, the angles being in said plane.

5. The lighting device according to claim 1, wherein the plurality of light-emitting filaments comprises at least three light-emitting filaments, the longitudinal axes of which are perpendicularly arranged with respect to radial directions to the optical axis.

6. The lighting device according to claim 1, wherein the collimator is a reflector or a total internal reflection collimator.

7. The lighting device according to claim 1, wherein each sub-collimator is configured to collimate light emitted by the corresponding light-emitting filament in a direction perpendicular to its longitudinal axis and in a direction parallel to said plane.

8. The lighting device according to claim 1, wherein each light-emitting filament is arranged at a distance from an inner surface of the corresponding recess.

9. The lighting device according to claim 1, wherein the light-emitting filaments are arranged to form at least one of a polygon shape and a star shape.

10. The lighting device according to claim 1, further comprising a controller configured to control the light emitted by the light-emitting filaments.

11. The lighting device according to claim 10, comprising:
    a first group of at least two light-emitting filaments, the first group having a first orientation in said plane, and
    a second group of at least two light-emitting filaments, the second group having a second orientation in said plane,
    wherein the first orientation is different from the second orientation, and wherein the controller is configured to individually control the first and second groups of light-emitting filaments.

12. A luminaire comprising:
    at least one lighting device according to claim 1;
    an electrical connection electrically connected to the at least one lighting device and configured to supply power to the at least one lighting device; and
    an exit window arranged to release light emitted by the at least one lighting device to the surroundings of the luminaire.

* * * * *